(12) United States Patent
Lu et al.

(10) Patent No.: US 6,778,429 B1
(45) Date of Patent: Aug. 17, 2004

(54) WRITE CIRCUIT FOR A MAGNETIC RANDOM ACCESS MEMORY

(75) Inventors: Yu Lu, Hopewell Junction, NY (US); William Robert Reohr, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 10/452,418

(22) Filed: Jun. 2, 2003

(51) Int. Cl.$^7$ .............................................. G11C 11/00
(52) U.S. Cl. ......................... 365/158; 365/97; 365/63
(58) Field of Search ........................... 365/158, 97, 51, 365/63

(56) References Cited

U.S. PATENT DOCUMENTS

| | | | |
|---|---|---|---|
| 6,034,882 A | * 3/2000 | Johnson et al. | ............... 365/63 |
| 6,335,890 B1 | 1/2002 | Reohr et al. | |
| 6,404,671 B1 | * 6/2002 | Reohr et al. | ............... 365/158 |
| 6,545,906 B1 | 4/2003 | Savtchenko et al. | |

OTHER PUBLICATIONS

W. Reohr et al., "Memories of Tomorrow," IEEE Circuits & Devices Magazine, vol. 18, No. 5, pp. 17–27, Sep. 2002.

* cited by examiner

*Primary Examiner*—Huan Hoang
(74) *Attorney, Agent, or Firm*—Wan Yee Cheung; Ryan, Mason & Lewis, LLP

(57) ABSTRACT

A write circuit for selectively writing one or more magnetic memory cells in an MRAM includes at least one programmable current source being couplable to one or more global word lines in the MRAM, the programmable current source including an input for receiving a first control signal and an output, the programmable current source generating at least a portion of a write current at the output having a magnitude which varies in response to the first control signal. The write circuit further includes a plurality of current sinks, each current sink being couplable to one or more global word lines in the MRAM, each current sink including an input for receiving a second control signal, each current sink returning at least a portion of the write current in response to the second control signal. A controller operatively coupled to the at least one programmable current source and the plurality of current sinks is operative to generate the first and second control signals and to selectively distribute the write current across a plurality of global word lines in the MRAM so that stray magnetic field interaction between selected memory cells and half-selected and/or unselected memory cells in the MRAM is minimized.

23 Claims, 6 Drawing Sheets

WRITE CIRCUIT FOR A MAGNETIC RANDOM ACCESS MEMORY

CROSS-REFERENCE TO RELATED APPLICATION

This application relates to commonly assigned U.S. application entitled "Segmented Word Line Architecture for Cross Point Magnetic Random Access Memory" and identified by Ser. No. 10/452,177 filed concurrently herewith, the disclosure of which is incorporated by reference herein.

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

The present invention relates generally to magnetic memory circuits, and more particularly relates to an improved architecture for cross point magnetic random access memory (MRAM).

BACKGROUND OF THE INVENTION

In conventional magneto-resistive memory architectures, writing individual memory cells without also writing adjacent or other non-intended cells, referred to as write selectivity, remains a problem. Typically, writing a magnetic tunnel junction (MTJ) memory cell, an exemplary magneto-resistive memory cell, involves passing electrical currents simultaneously through a bit line (generally defined along a y axis) and a word line (generally defined along an x axis) at the intersection of which the intended MTJ cell resides. Thus, selected memory cells in an MRAM are written by the coincidence of x-oriented and y-oriented magnetic fields. The selected MTJ cell will experience a magnetic field which is the vector sum of the magnetic fields created by the word and bit line currents. All other MTJ cells that share the same bit line or word line as the selected MTJ cell will be half-selected and will thus be subjected to either bit line or word line magnetic fields, respectively. An MTJ cell receiving no bit line or word line magnetic field will be unselected.

Variations in the geometry (e.g., shape or size) of an MTJ memory cell can give rise to variations in magnetic thresholds of the MTJ cells which are so large that it is virtually impossible to write a selected cell without also arbitrarily switching some of the half-selected cells, thus placing the reliability and validity of the stored data in question. There may also be other factors, for example, related to manufacturing uncertainties and intrinsic magnetic material variability (e.g., temperature and processing variations) such that cell to cell magnetic response variations can be significantly large. This magnetic response variability from cell to cell adversely impacts the write select margin of the MRAM device. Additionally, the spontaneous switching of an MTJ cell when it is subjected to repeated magnetic field excursions much smaller than its nominal switching field, either by an effect known as "creep" or by thermal-activated switching, narrows the acceptable write select margin even further thereby making the need for greater write selectivity of individual MTJ memory cells even more imperative.

A write disturb is generally defined as an unintended change in the logical state of an unselected memory cell while a selected cell, which is targeted for a write operation, is written to a new logical state. The avoidance of write disturbs is a critical issue for MRAM devices. In conventional MRAM, selected memory cells are written by the coincidence of x-oriented and y-oriented magnetic fields, as stated above. Ideally, half-selected memory cells receive only one of the two fields. The force of only one field on a magnetic memory cell is typically not enough to change the polarity, and therefore the state, of the cell. In practice, however, stray magnetic fields (e.g., emanating from adjacent word lines, etc.) may combine to make a half-selected memory cell susceptible to write disturbs. This is an undesirable characteristic which is inherent in a conventional cross-point write scheme.

A major hurdle to the realization of practical MRAM architectures has been the problem of write selectivity. The avoidance of write disturbs in cross point MRAM has, thus far, only been addressed by Reohr, et al., in U.S. Pat. No. 6,335,890. However, the prior art does not provide a means to minimize the stray magnetic fields generated as a byproduct of delivering the hard axis field to the selected memory cells. Moreover, since the prior art only addresses a write operation, it does not provide an adequate circuit structure for maintaining an equipotential voltage, necessary for subsequent read operations, on all word lines except those required to carry current to the word line corresponding to the selected memory cells.

There exists a need, therefore, in the field of magnetic memory devices for improved write selection techniques which can be readily adapted to a cross point MRAM architecture as well as other alternative magnetic memory architectures.

SUMMARY OF THE INVENTION

The present invention provides techniques for effectively writing memory cells in an MRAM. By selectively controlling the path of the write current flowing in the cross point MRAM so that the write current traverses a subset of word lines in the MRAM, stray magnetic field interaction with unselected memory cells in the array is substantially reduced. In this manner, a write selectivity of the cross point MRAM is advantageously improved. Moreover, the write current only affects the voltage on a subset of word lines involved in the write operation, leaving the bulk of the word lines at an equipotential voltage as is necessary for a read operation.

In accordance with one embodiment of the invention, a write circuit for selectively writing one or more magnetic memory cells in an MRAM includes at least one programmable current source couplable to one or more global word lines in the MRAM, the programmable current source including an input for receiving a first control signal and an output, the programmable current source generating at least a portion of a write current at the output having a magnitude which varies in response to the first control signal. The write circuit further includes a plurality of current sinks, each current sink being couplable to one or more global word lines in the MRAM, each current sink including an input for receiving a second control signal, each current sink returning at least a portion of the write current in response to the second control signal. A controller operatively coupled to the at least one programmable current source and the plurality of current sinks is operative to generate the first and second control signals and to selectively distribute the write current across a plurality of global word lines in the MRAM so that stray magnetic field interaction between selected memory cells and half-selected and/or unselected memory cells in the MRAM is minimized.

These and other objects, features and advantages of the present invention will become apparent from the following detailed description of illustrative embodiments thereof, which is to be read in connection with the accompanying drawings.

BRIEF DESCRIPTION F THE INVENTION

DETAILED DESCRIPTION OF PREFERRED EMBODIMENTS

The present invention will be described herein in the context of an illustrative MRAM. It should be appreciated, however, that the present invention is not limited to this or any particular magnetic memory architecture. Rather, the invention is more generally applicable to a magnetic memory device wherein it is desirable to provide improved write selection techniques. Moreover, although implementations of the present invention are described herein using complementary metal-oxide-semiconductor (CMOS) devices and magnetic tunnel junction (MTJ) devices, it should be appreciated that the invention is not limited to such devices, and that other suitable devices, such as, for example, bipolar junction transistor (BJT) devices and other magneto-resistive memory elements may be similarly employed, with or without modifications to the inventive memory architecture, as will be understood by those skilled in the art.

Figure 1:
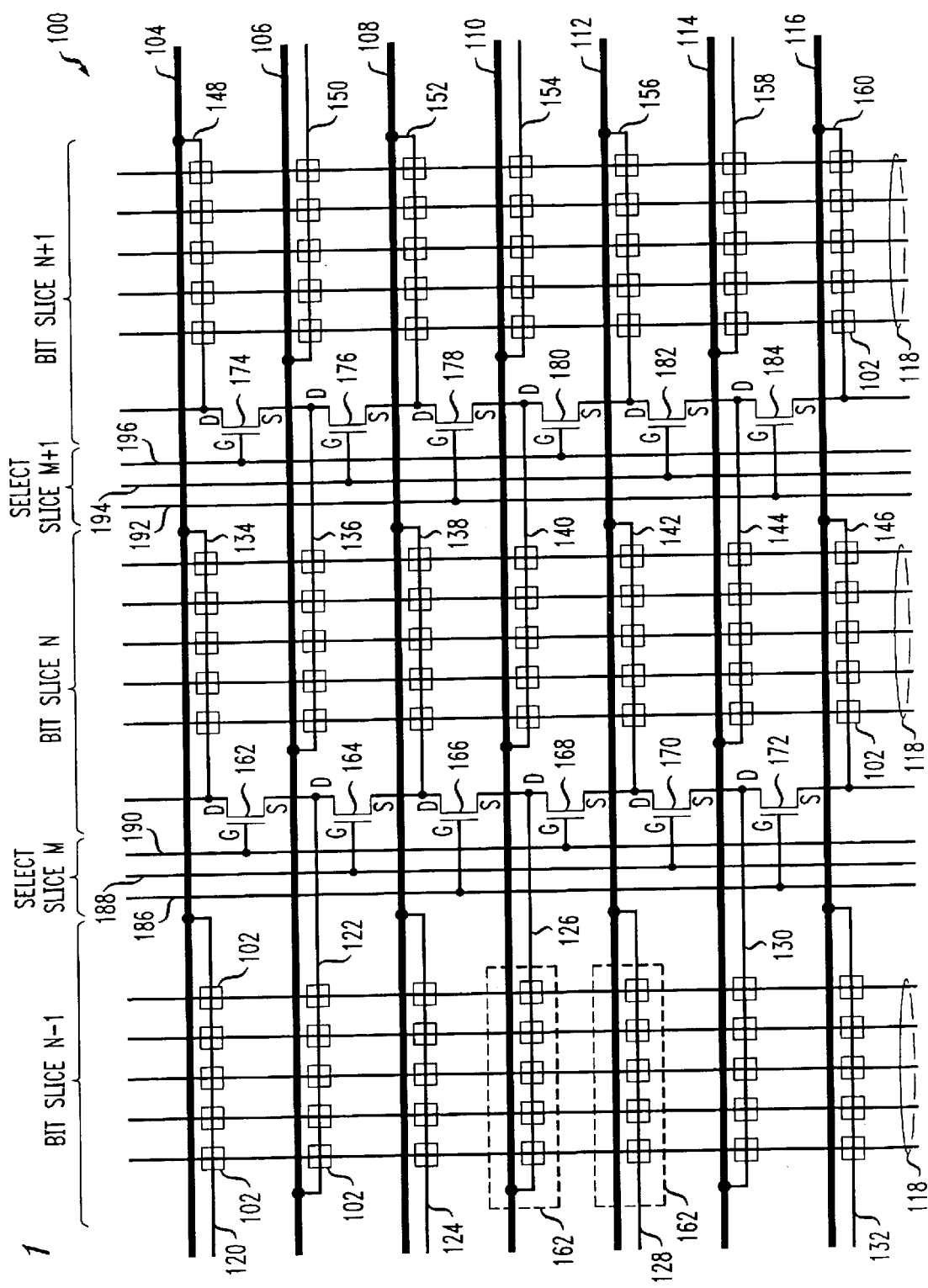
FIG. 1 is a schematic diagram depicting at least a portion of an exemplary MRAM array, formed in accordance with an illustrative embodiment of the present invention.

FIG. 1 depicts at least a portion of an exemplary MRAM 100 in which the techniques of the present invention may be implemented. As apparent from the figure, MRAM 100 utilizes a segmented write line architecture for improving write selectivity. A segmented write line architecture is discussed in general, for example, in U.S. Pat. No. 6,335,890 to Reohr et al., which is incorporated by reference herein. The techniques of the present invention provide further improvements to the segmented write line architecture.

The exemplary MRAM 100 includes a plurality of bit lines 118 oriented in a vertical or column dimension and a plurality of word lines. Each of at least a portion of the word lines comprises a global word line 104, 106, 108, 110, 112, 114 and 116, functioning essentially as a bus, and a plurality of corresponding local word lines 120, 122, 124, 126, 128, 130,132, 134, 136, 138, 140, 142, 144, 146, 148, 150, 152, 154, 156, 158 and 160 connected thereto. For example, local word lines 120, 134 and 148 are connected to global word line 104, local word lines 122, 136 and 150 are connected to global word line 106, local word lines 124, 138 and 152 are connected to global word line 108, local word lines 126, 140 and 154 are connected to global word line 110, local word lines 128, 142 and 156 are connected to global word line 112, local word lines 130, 144 and 158 are connected to global word line 114, and local word lines 132, 146 and 160 are connected to global word line 116. The global and local word lines are preferably arranged substantially parallel to one another, in a horizontal or row dimension, and orthogonal to the bit lines 118, although the invention is not limited to any particular orientation of the bit lines and word lines. Additionally, any number of bit lines, global word lines and associated local word lines may be included in the MRAM array 100, depending on the size and organization of the array, as will be understood by those skilled in the art.

The illustrative MRAM 100 further comprises a plurality of magnetic memory cells 102, each of the memory cells being located at an intersection of a bit line and a corresponding local word line. The memory cells 102 may each comprise a magnetic storage element (e.g., an MTJ device) for storing the logical state of the cell. In the case of a cross-point memory array, each of at least a portion of the memory cells 102 is electrically connected to a particular bit line 118 at a first terminal associated with the memory cell 102 and to a corresponding local word line at a second terminal of the memory cell.

The memory cells 102 in MRAM 100 are preferably arranged into segmented groups 162, each segmented group being physically connected to a corresponding local word line. It is important that the local word lines be physically separated from their corresponding global word lines and from one another by a predetermined distance but yet be in close relative proximity to their corresponding segmented group of memory cells so that a magnetic field generated by a write current flowing through a local word line intended for a selected segmented group will be able to write the logical state of the memory cells in the selected segmented group and yet have substantially no impact on, other non-selected segmented groups. In the exemplary cross-point MRAM, the local word lines are not only in close physical proximity to their corresponding segmented group of memory cells but are also in electrical contact therewith.

One or more segmented groups 162 of memory cells may be organized into one or more bit slices N−1, N and N+1 long a column dimension. The present invention similarly contemplates alternative organizations of the memory cells 102, as will be understood by those skilled in the art. A particular bit slice may be defined to include all memory cells 102 connected to a given bit line 118, and all bit lines corresponding to the memory cells in a given segmented group 162 are preferably included in the bit slice.

One benefit of the segmented MRAM architecture employed in the illustrative MRAM 100 is that a write current, for writing the logical state of one or more memory cells 102 in the MRAM, traverses through the array via the global word lines 104, 106, 108, 110, 112, 114, 116 without inadvertently writing unselected memory cells in the array. This is accomplished primarily by spacing the global word lines far enough from the memory cells 102 that the stray magnetic fields generated by the global word lines do not couple a significant hard axis magnetic field into unintended memory cells which could otherwise disturb the unintended memory cells. The term "disturb" as used herein may be defined as an unintentional change in the logical state of a memory cell. Instead, using the segmented architecture of the present invention, the write current flows from a global word line to a corresponding local word line associated with a selected group of memory cells to be written. Since the local word lines are in close relative proximity to the memory cells to which they correspond, the write current passing through a selected local word line generates a magnetic field which provides a large enough hard axis field so as to assist in writing the logical state of the selected subset of memory cells.

It is well known that the magnetic field strength of a wire conductor carrying a current decays as the inverse of the radial distance outward from the conductor. Thus, magnetic isolation can be achieved by adequately spacing one group of memory cells from the conductor(s) used to write a neighboring group of memory cells. This spacing will depend, at least in part, on certain characteristics associated with the magnetic storage element in the memory cell itself (e.g., as may be defined by a switching astroid associated with the magnetic storage element) and on environmental conditions, such as, for example, temperature, integrated circuit (IC) process parameters, etc. An optimal spacing for the MRAM will essentially involve a tradeoff between write selectivity and MRAM density.

The exemplary MRAM 100 further includes a plurality of select switches 162, 164, 166, 168, 170, 172, 174, 176, 178, 180, 182 and 184, and a plurality of corresponding select lines 186, 188, 190, 192, 194 and 196 coupled to the select switches. In combination with row driver circuits (not shown in FIG. 1, but whose detail is described with respect to FIG. 4 below) operatively connected to the ends of the global word lines, the select switches and respective select lines are used to steer write current through a selected local word line via a network of one or more active global word lines that source the write current and one or more global word lines that return the write current, while isolating other inactive global word lines and local word lines in the MRAM. In this manner, the write current can be directed to a selected group of memory cells to be written without impacting other regions of the MRAM that are held at an equipotential voltage to be exploited by a subsequent read operation of the MRAM.

The select switches are preferably implemented as transistors (e.g., field-effect transistors (FETs)), as shown in the figure, although at least a portion of the select switches may comprise alternative switching circuitry (e.g., multiplexer). Furthermore, other switching configurations for selectively directing the write current through the word lines (i.e., global and local word lines) in the MRAM are contemplated by the present invention.

As apparent from the figure, each of the select switches includes first and second terminals, which may be a drain terminal (D) and a source terminal (S), respectively, of a FET, and a third terminal, which may be a gate terminal (G) of the FET, for receiving a control signal presented thereto. The switches are preferably configurable for providing a substantially low resistance (e.g., less than one ohm) electrical connection between the first and second terminals in response to the control signal presented to the third terminal.

At least a portion of the select switches 162, 164, 166, 168, 170, 172, 174, 176, 178, 180, 182, 184 may be arranged into one or more select slices M, M+1 in a column dimension. A particular select slice, e.g., select slice M, may be defined to include a plurality of select switches, e.g., switches 162, 164, 166, 168, 170, 172, and a plurality of select lines 186, 188, 190 coupled to corresponding select switches, the select lines being used to convey the control signals for selectively activating the switches in the corresponding select slice. Likewise, select slice M+1 may comprise a plurality of select switches 174, 176, 178, 180, 182, 184, and a plurality of select lines 192, 194, 196 coupled to corresponding select switches in the select slice. The switches in a given select slice are preferably connected together in a series chain, such that the first terminal of one switch is connected to the second terminal of another switch.

Figure 2:
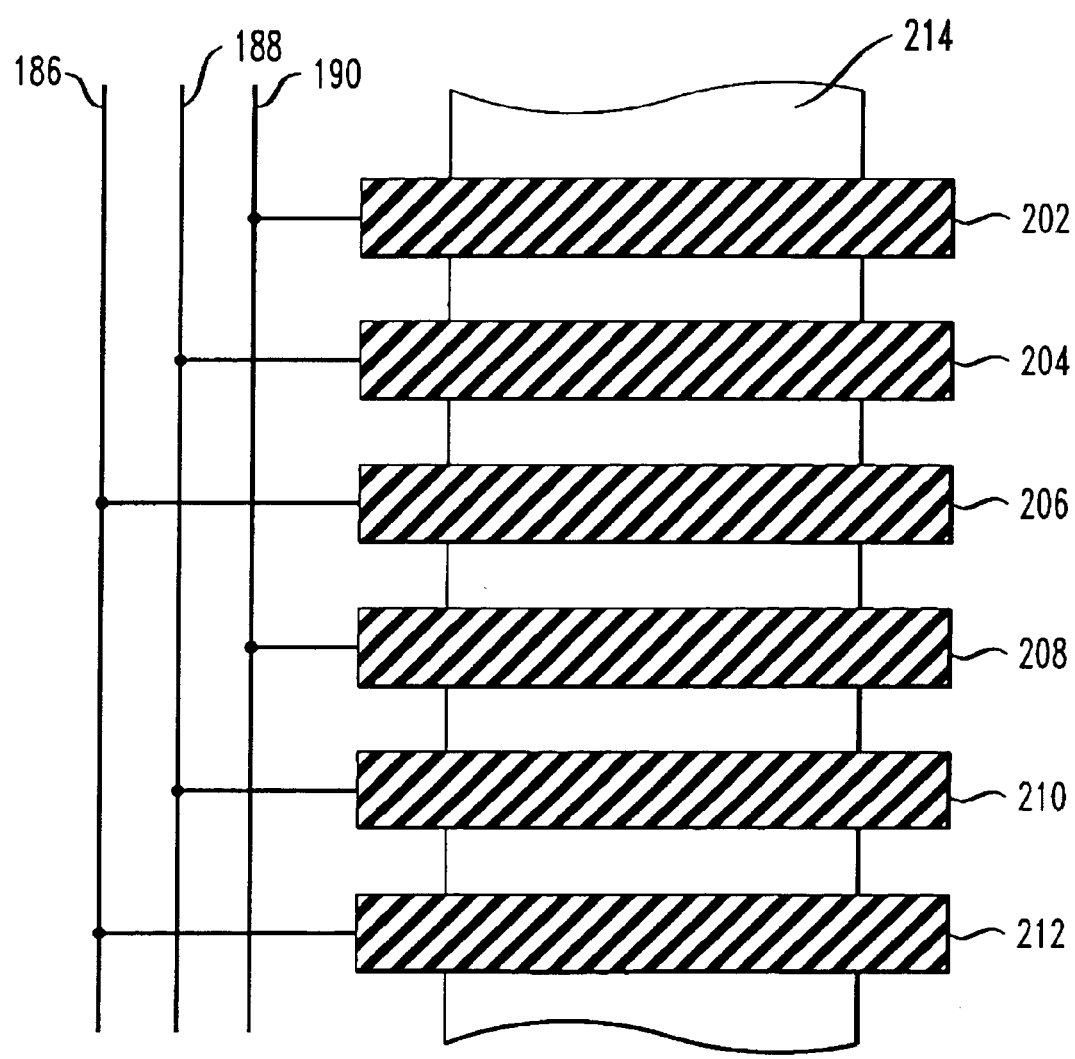
FIG. 2 is a top plan view illustrating an exemplary semiconductor layout of at least a portion of group of select switches which may be used in the exemplary MRAM array of FIG. 1, in accordance with the invention.

FIG. 2 is a top plan view depicting an illustrative semiconductor layout of a select slice, e.g., select slice M, which may be used in the exemplary MRAM 100 of FIG. 1, the select slice including a plurality of select switches and corresponding select lines 186, 188 and 190 coupled thereto. As apparent from the figure, the select switches are preferably implemented as a chain of transistors, the gate terminals being formed by a polysilicon layer patterned into individual gate sections 202, 204, 206, 208, 210 and 212 and the drain and source terminals of the respective transistors being formed by an active area 214 in a conventional manner.

With reference again to FIG. 1, in the exemplary MRAM 100, each select slice preferably resides between two adjacent bit slices. The first terminal of a given switch in the select slice is preferably connected to one end of a local word line in one of the bit slices, while the other end of the local word line is connected to a corresponding global word line. The select slice may be organized such that successive switches in the chain of select switches are connected to local word lines in alternating bit slices. Thus, any given select switch is preferably connected between local word lines residing in adjacent bit slices. The select slice may also reside between two bit slices separated by one or more bit slices, as shown, for example, in FIG. 9 of U.S. Pat. No. 6,335,890 to Reohr et al. The present invention is not limited to a particular bit and/or select slice arrangement.

For example, select slice M preferably resides between bit slices N−1 and N. The drain terminal of switch 162 is connected to local word line 134 in bit slice N, while the drain terminal of successive switch 164 in the chain of select switches is connected to local word line 122 in bit slice N−1. Likewise, the drain terminal of the next successive switch 166 in the chain of select switches is coupled to local word line 138 in bit slice N, and so forth, alternating between local word lines in bit slices N−1 and N until all local word lines in the respective bit slices are connected to a corresponding select switch.

The exemplary MRAM 100 may also include a plurality of row and column drivers (not shown) operatively coupled to the global word lines 104, 106, 108, 110, 112, 114, 116 and bit lines 118, respectively, for selectively reading and writing the logical state of one or more memory cells in the MRAM. Addressing the write operation in particular, the row drivers may comprise circuitry for generating a write select current for supplying a hard axis field to one or more memory cells during the write operation. Additionally, it should be noted that the row and column drivers coupled to the global word lines and bit lines, respectively, are preferably configurable for maintaining an equipotential voltage on all of the bit lines and word lines that are not actively involved in the write operation. The equipotential voltage may be, for example, a constant voltage halfway between the positive and negative voltage supplies (e.g., VDD/2). Only the row driver circuitry directed to the write operation will be described in further detail herein below.

In accordance with an illustrative embodiment of the present invention, the write select current that assists in writing the logical state of one or more memory cells 102 in the MRAM 100 is sourced along one global word line and returned along two most adjacent global word lines. Three global word lines and two corresponding select switches form a conductive network through which the write select current may flow during a given write operation. In order to confine the write select current to the conductive network, at least three select lines are required for any particular select slice. For alternative memory array organizations, as may be contemplated by the invention, a different number of global word lines may be utilized to return the write current and thus a different number of select switches and corresponding select lines may be required. For example, in accordance with an alternative embodiment of the invention, the write current may be sourced by one global word line and returned along four most adjacent global word lines.

By way of example only, suppose that the memory cells connected to local word line 126 are to be written. Before the write operation commences, select lines 186 and 190 are activated by the application of a logic high voltage (e.g., 3.3 volts) thereto, while select line 188 is made inactive by the application of a logic low voltage (e.g., zero volts) thereto. Application of a logic high voltage on select lines 186 and 190 will activate (i.e., turn on) the switches corresponding to these select lines, namely, switches 162, 166, 168 and 172. Switches 166 and 168 provide conduction paths from global word line 10 to global word line 108, and from global word line 110 to global word line 112, respectively. The former conduction path is established via global word line 110, the source line, through local word line 126, through switch 166, through local word line 138, and finally to global word line 108, the return line. Likewise, the latter conduction path is established via global word line 110, the source line, through local word line 126, through switch 168, through local word line 142, and finally to global word line 112, the return line.

Although other switches, namely switches 162 and 172, may also provide conduction paths connecting other global word lines to one another (e.g., global word lines 106 to 104 and global word lines 114 to 116), and hence connect the global word lines together, they preferably do so only in a section of the MRAM where the global word lines are intended to be biased to the equipotential voltage Veq, as previously stated. Since the connected global word lines will be at substantially the same voltage potential, no current will flow between them, and thus the unselected memory cells associated with these other conduction paths will not be inadvertently written.

The global word lines (e.g., global word lines 106 and 114) which are biased to Veq do not interfere with those global word lines that are actively involved in the write operation (e.g., global word lines 108, 110 and 112). Switches 164 and 170 prevent such interaction since they are open-circuited by application of a logic low voltage on select line 188, as stated above. Consequently, the inclusion of three or more select lines in each select slice provides a means of selectively isolating the global word lines carrying the write current from those global word lines biased to the equipotential voltage Veq.

As previously stated, the exemplary MRAM 100 may comprise one or more row decoders (not shown) operatively coupled to the global word lines. The row decoders preferably include one or more current sources for generating the write current used for writing the logical state of one or more memory cells in the array. Each current source may be coupled to a respective one of the global word lines. Preferably, each of at least a portion of the current sources are configurable for supplying a variable quantity of write current to the global word lines. In this manner, the magnetic fields generated by the respective global word lines proximate to unselected, half-selected and/or full-selected memory cells in the MRAM may be more accurately controlled.

Figure 3:
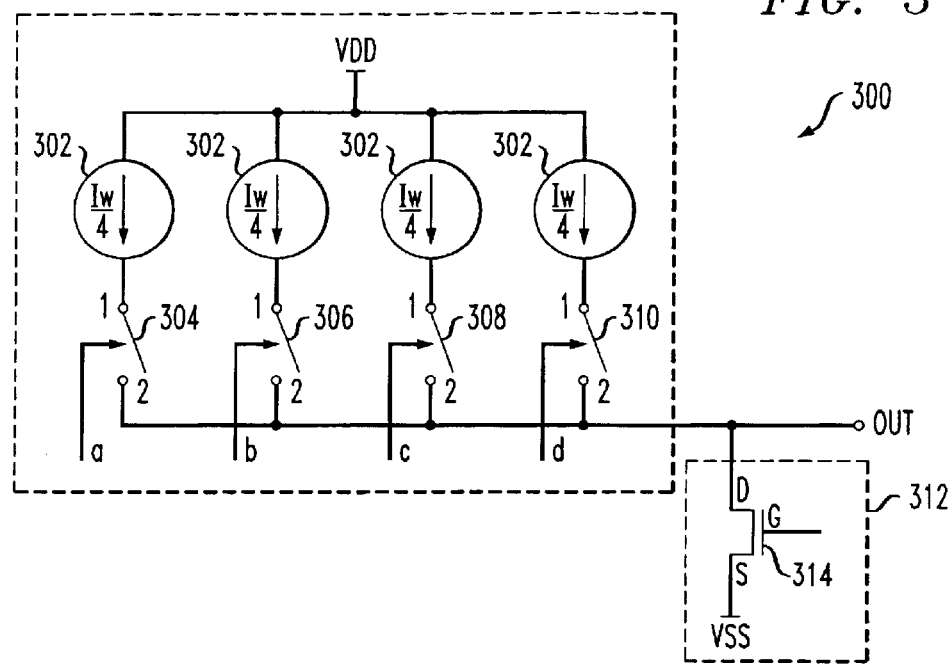
FIG. 3 is a schematic diagram illustrating an exemplary write circuit which may be used in conjunction with the MRAM array shown in FIG. 1, in accordance with the invention.

FIG. 3 depicts an exemplary write circuit 300 which may be used with the MRAM of FIG. 1 for supplying a variable write current to one or more global word lines in the MRAM array, in accordance with an illustrative embodiment of the invention. The exemplary write circuit 300 includes a plurality of constant current sources 302 and a plurality of switches 304, 306, 308 and 310, each one of the switches being coupled to a respective one of the current sources 302 at a first terminal. A second terminal of each of the switches is coupled to an output OUT of the write circuit 300.

It is to be appreciated that although only four current sources 302 are depicted in the figure, the present invention is not limited to this or any particular number of current sources. Furthermore, although each current source 302 is depicted as generating a current of $I_w/4$, the current sources 302 are not limited to any particular current value. As the number of current sources employed in the write circuit 300 is increased, the resolution in the output write current can be adjusted in finer increments accordingly. For example, if six current sources are used instead of four, each current source can be configured to generate a current of $I_w/6$. Thus, the write current output from the write circuit 300 may be adjusted in increments of ⅙ rather than in increments of ¼, as will be understood by those skilled in the art.

Each of the switches 304, 306, 308, 310 preferably includes a control input for receiving a control signal a, b, c, and d, respectively, applied thereto. The switches are adapted to selectively connect a corresponding current source 302 to the output of the write circuit 300 in response to the respective control signals. The output OUT of the write circuit 300 essentially functions as a summing junction. Thus, by activating a select number of switches 304, 306, 308, 310 via control signals a, b, c, d, respectively, the constant current sources 302 can be used either alone or in any combination to supply write current levels of ¼$I_w$, ½$I_w$, ¾$I_w$, or $I_w$ on the global word lines. A controller (not shown), which may comprise a decoder, is preferably used to generate the controls signals for controlling the current source and sink. The controller may further be operative to selectively distribute the write current throughout the MRAM in a manner which advantageously reduces the stray magnetic field interaction between selected and unselected memory cells in the MRAM.

The exemplary write circuit 300 may also comprise a current sink 312 coupled to the output OUT for providing a conduction path between the output and a negative voltage supply (e.g., VSS or ground). To accomplish this, the current sink 312 may comprise a FET 314 having a drain terminal (D), a source terminal (S) and a gate terminal (G). The FET 314 may be configured such that a substantially low resistance connection is established between the output OUT and VSS when an appropriate control signal (e.g., VDD) is applied to the gate terminal of the FET, as will be understood by those skilled in the art. Alternative current sink circuitry may be similarly employed with the present invention. The write circuit 300 may be selectively configurable as either a current source or as a current sink, such as, for example, in response to a control signal applied to the write circuit.

In a case where two or more current sinks 312 are simultaneously coupled to the same global word line, it is contemplated that the conductance of either current sink 312 may be modified in order to balance or imbalance the current through each current sink, primarily for the purpose of accurately regulating the magnetic fields surrounding unselected, half-selected, and/or full-selected memory cells in the MRAM.

Figure 4:
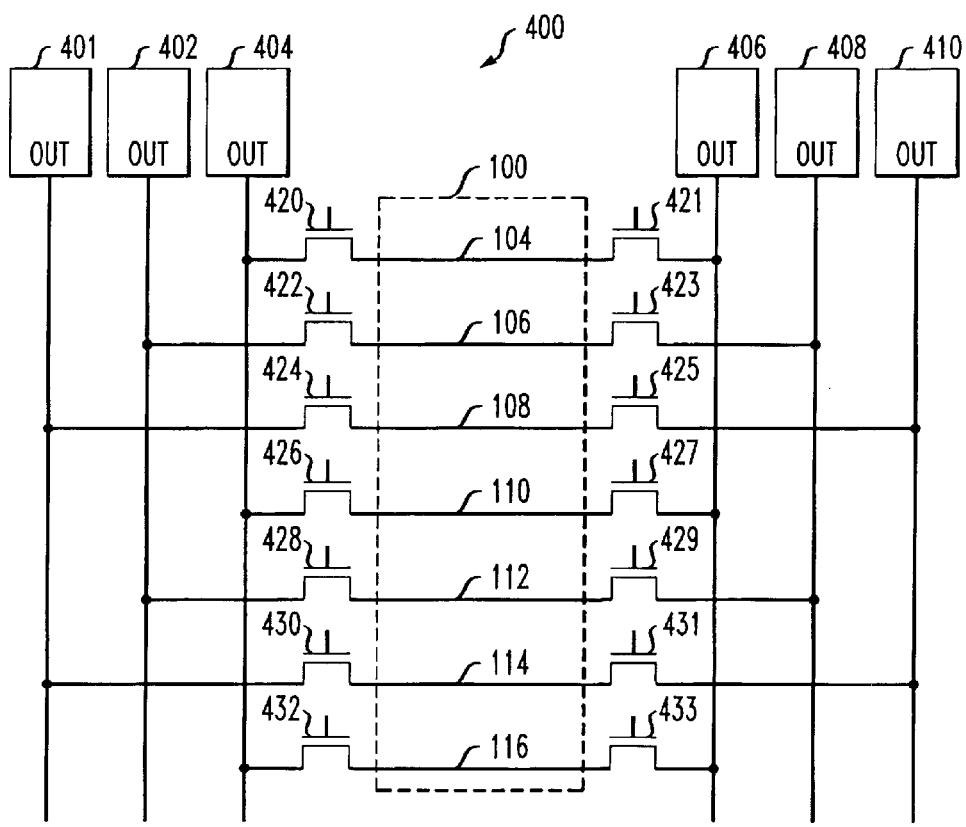
FIG. 4 is a schematic diagram illustrating at least a portion of an exemplary cross point MRAM circuit, formed in accordance with one embodiment of the present invention.

With reference to FIG. 4, at least a portion of an exemplary MRAM circuit 400 is shown, formed in accordance with one embodiment of the present invention. The exemplary MRAM circuit 400 includes a plurality of write circuits 401, 402, 404, 406, 408 and 410, at least a portion of which may be implemented in a manner consistent with the exemplary write circuit 300 depicted in FIG. 3. It is to be understood that only circuits directed to the write operation are shown and that the invention is not limited to the precise number and/or arrangement of the write circuits. The write circuits are preferably configurable as a current source for generating a write current and/or a current sink for returning the write current at a respective output node OUT.

The write circuits in the exemplary MRAM circuit 400 are operatively coupled to one or more global word lines 104, 106, 108, 110, 112, 114, and 116 in an MRAM array 100 via a plurality of row switches 420, 421, 422, 423, 424, 425, 426, 427, 428, 429, 430, 431, 432, and 433, which may be a subcomponent of the aforementioned row drivers directed to the write operation. Each of the row switches is preferably coupled to a given end of a corresponding global word line such that when activated, for example, in response to a control signal presented thereto, the row switch connects a write circuit to a corresponding global word line.

By way of example only, in the exemplary MRAM circuit 400, write circuit 401 is coupled to first ends of global word lines 108 and 114 via row switches 424 and 430, respectively, write circuit 402 is coupled to first ends of global word lines 106 and 112 via row switches 422 and 428, respectively, and write circuit 404 is coupled to first ends of global word lines 104, 110, and 116 via row switches 420, 426, and 432, respectively. Likewise, write circuit 406 is coupled to second ends of global word lines 104, 110, and 116 via row switches 421, 427, and 433, respectively, write circuit 408 is coupled to second ends of global word lines 106 and 112 via row switches 423 and 429, respectively, and write circuit 410 is coupled to second ends of global word lines 108 and 114 via row switches 425 and 431, respectively. Using one or more of the aforementioned write circuits, switches and corresponding conductors (e.g. global and local word lines), the write current can be selectively directed to supply a magnetic field in close relative proximity to one or more targeted memory cells in the MRAM array 100.

In accordance with an important aspect of the invention, during a write operation, the write circuits, switches and corresponding conductors (e.g., global and/or local word lines) in the exemplary MRAM circuit 400 may be configured such that the total write current is divided, whereby a portion (e.g., half) of the write current is supplied by a first write circuit, configured as a current source, and the remaining portion (e.g., half) is supplied by at least a second write circuit, also configured as a current source. The respective portions of write current traverse a plurality of conductors (e.g., global and/or local word lines) and sum together at a local word line corresponding to the selected memory cell(s). The plurality of conductors along which the respective write currents traverse may include essentially any combination of one or more global and/or local word lines. Likewise, the exemplary MRAM circuit 400 may be configured so that the write current is returned to a plurality of write circuits, each configured as a current sink, via a plurality of write current return paths. Each of the write current return paths may comprise a plurality of conductors (e.g., global and/or local word lines). The row switches are selectively activated so that the corresponding global word lines conduct current from the write circuits configured as current sources to the write circuits configured as current sinks. As in the case of the write current sourced by the respective write circuits, the plurality of conductors along which the write currents are returned may include essentially any combination of one or more global and/or local word lines.

Using the techniques of the present invention, the MRAM circuit may be configured such that no single global word line carries the entire amount of write current. Rather, the write current is distributed across a plurality of conductors forming a current conduction network. In this manner, the effects of stray magnetic field interaction with unselected or half-selected memory cells in the MRAM can be substantially eliminated. Furthermore, the global word lines can be made significantly smaller compared to global word lines carrying the full write current, thereby allowing a more dense memory array to be fabricated.

By way of example only, consider a write operation in which write circuit 402 is configured as a current source for supplying the write current ($I_W$) to the memory array 100. When row switch 422 is activated, write circuit 402 is connected to one end of global word line 106. The current 1w generated by write circuit 402 is supplied to global word line 106 and preferably directed through a selected local word line (not shown). As previously described in conjunction with FIG. 1, the write current may be directed to a particular local word line by selectively activating of one or more select switches in the exemplary MRAM 100. The write current may then be returned to write circuits 401, 404, 406 and 410, each configured as a current sink, along global word lines 104 and 108 by activating row switches 420, 421, 424 and 425. Assuming each of the write circuits 401, 404, 406, 410 arc of substantially equal impedance, the return currents will divide into four substantially equal portions ($¼I_W$) returned to each respective write circuit.

In another exemplary write operation, the write current may be generated by write circuits 401 and 410, each configured as a current source for supplying half of the total write current ($½I_W$) to the memory array 100. When row switches 424 and 425 are activated, the two write circuits 401 and 410 are connected to respective ends of global word line 108. The two currents $½I_W$ generated by the write circuits 401 and 410 are supplied to respective ends of global word line 108 and are summed at a selected local word line (not shown) such that the total write current $I_W$ flows through the selected local word line. As previously described in conjunction with FIG. 1, the write current may be directed to a particular local word line by appropriate activation of one or more select switches in the exemplary MRAM 100. After passing through the selected local word line, the write current is preferably divided (e.g., by selectively activating one or more select switches in the exemplary MRAM 100 shown in FIG. 1) and returned along neighboring global word lines 106 and 110 to write circuits 402, 404, 406 and 408, each configured as a current sink, via row switches 422, 426, 427 and 423, respectively.

Figure 5A:
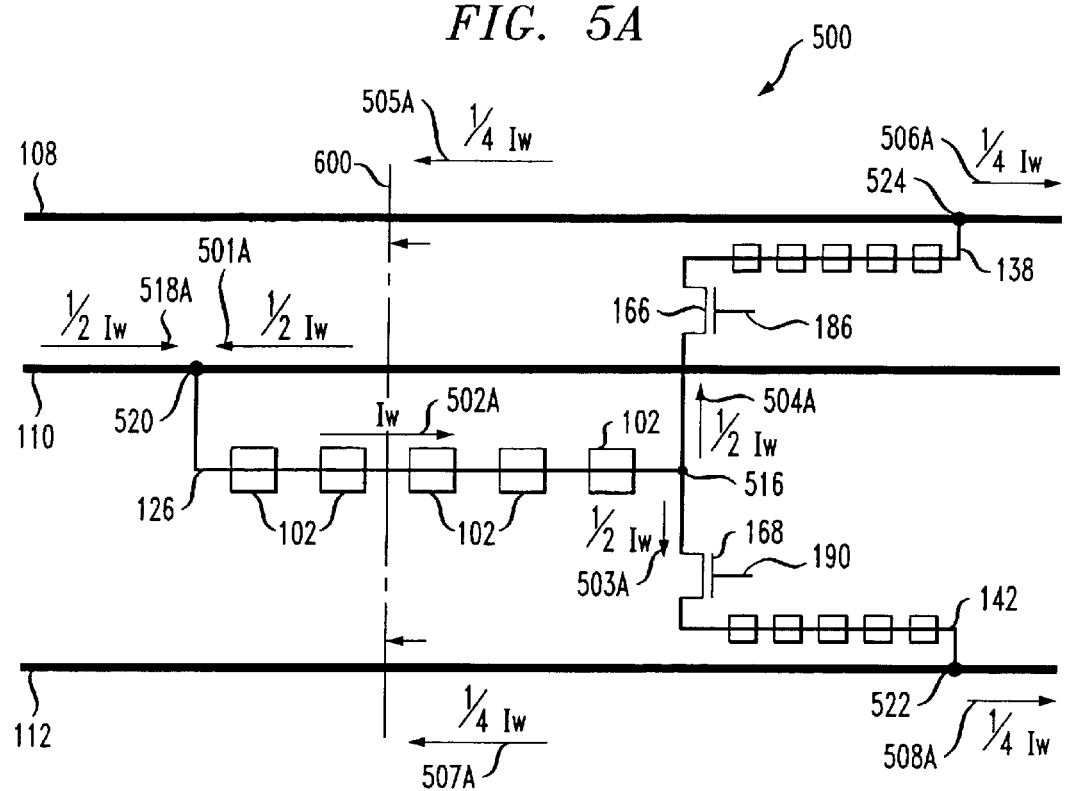
FIGS. 5A–5C are schematic diagrams illustrating alternative techniques for steering write current to a selected group of memory cells, in accordance with the present invention.
Figure 5B:
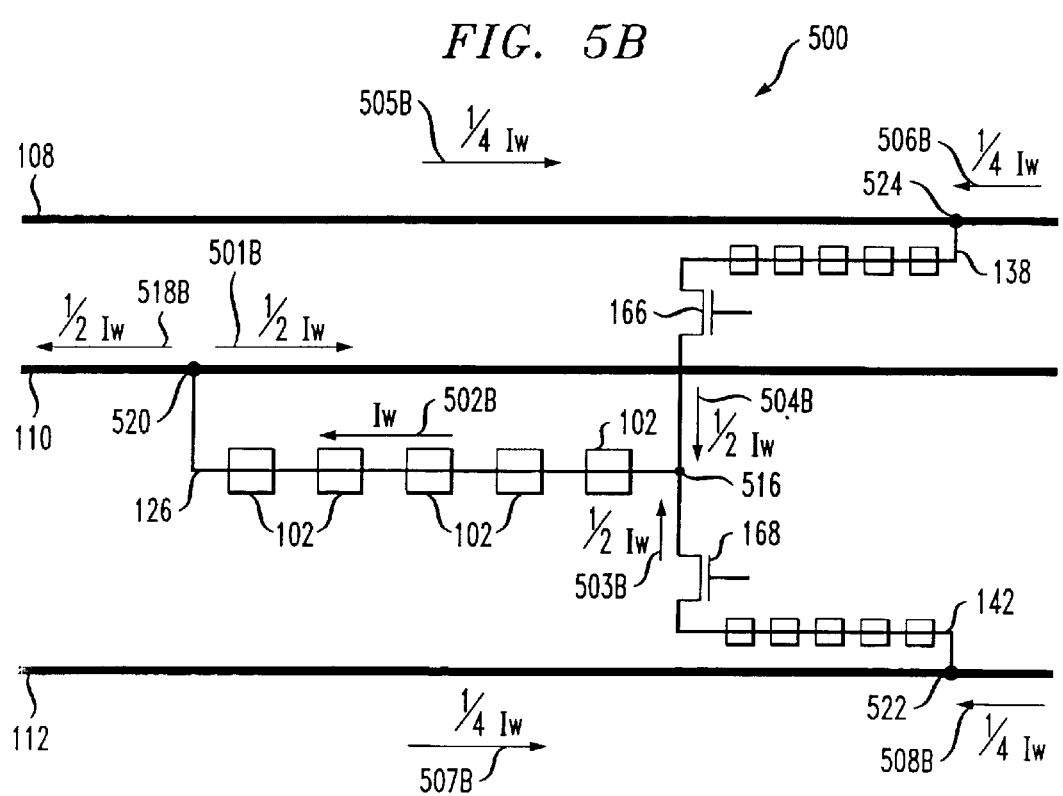
Figure 5C:
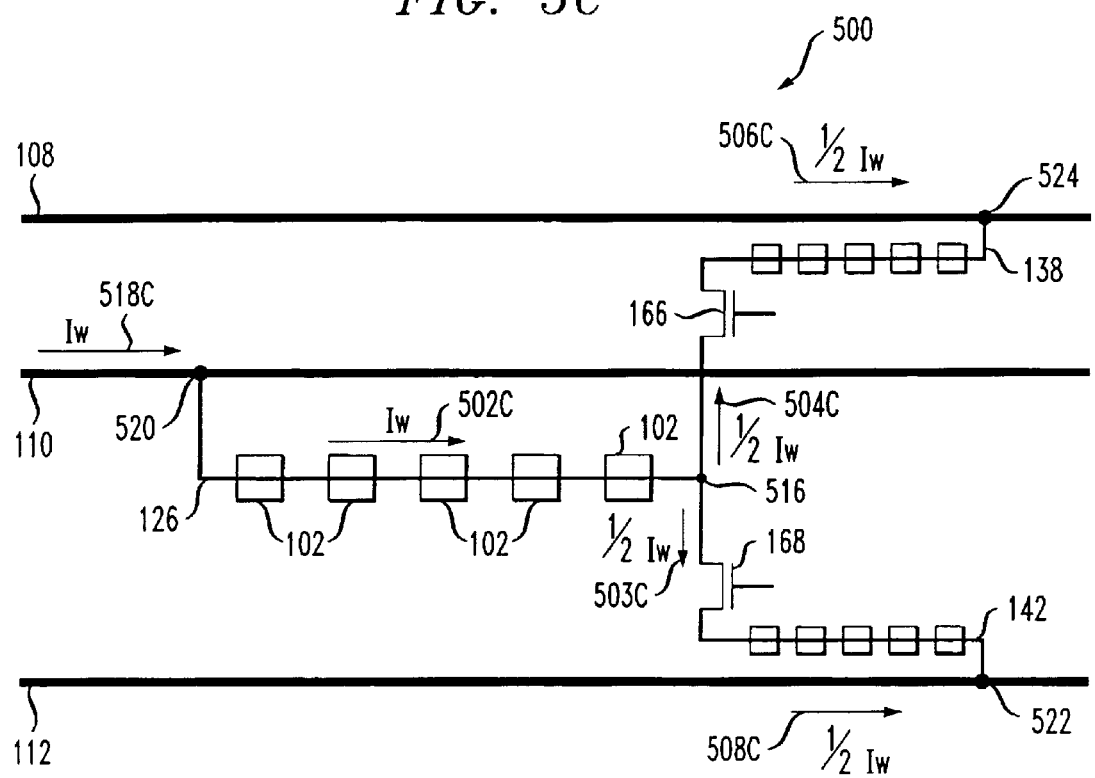

FIGS. 5A through 5C depict at least a portion of the MRAM of FIG. 1, illustrating exemplary conduction paths 500 used to illustrate alternative methodologies for directing a write current $I_W$ through a group of selected memory cells 102 corresponding to a given local word line 126 in the MRAM array, in accordance with the present invention. It is to be appreciated that the invention described herein is not limited to the precise configurations shown but may include various other arrangements, as will be understood by those skilled in the art.

As previously stated, an important aspect of the invention is that the MRAM circuit is preferably configurable so that the total write current is returned to two or more write circuits, each configured as a current sink, via a plurality of conductors (e.g., global and local word lines) in the MRAM array. In an alternative embodiment of the invention, described herein above, the write current may be supplied from two or more write circuits, each configured as a current source, via a plurality of conductors (e.g., global and local word lines). In this instance, a portion of the write current is supplied by a first write circuit and the remaining portion is supplied by at least a second write circuit to generate the total write current $I_W$. The respective portions of write current, which may be conveyed along a plurality of conductors, preferably sum together at a local word line corresponding to the selected memory cell(s).

By way of example only, FIG. 5A depicts at least a portion of the MRAM shown in FIG. 1, illustrating an exemplary conduction network 500 configured so that a total write current $I_W$ can he supplied from two separate current sources along a single global word line 10 and can be returned to four separate current sinks along two neighboring global word lines 108 and 112. This may be accomplished, at least in part, by activating the appropriate row switches corresponding to the desired global word lines. As apparent from the figure, a first current 518A, which has a magnitude of one half the total write current (i.e., $\frac{1}{2}I_W$), is sourced from a first end of global word line 110, and a second current 501A, which also has a magnitude of $\frac{1}{2}I_W$, is sourced from a second end of global word line 110. The two currents 518A, 501A sum together at node 520 to form the write current 502A, having a magnitude of $I_W$, which flows through the local word line 126 corresponding to the selected memory cells 102. As the current 502A passes through the local word line 126, it creates a hard axis magnetic field component emanating from the local word line 126 which assists in writing memory cells 102 residing in close relative proximity thereto.

In order to provide a return current path, select switches 166 and 168 are activated (i.e., turned on), for example, by applying a control signal, which may be the positive voltage supply (e.g., VDD) on select lines 186 and 190, respectively, coupled to the select switches. When activated, select switch 166 provides an electrical connection between local word lines 126 and 138 that further connects global word lines 110 and 108 together. Likewise, when switch 168 is activated, an electrical connection is established between local word lines 126 and 142 that further connects global word lines 110 and 112 together.

After passing through local word line 126, the write current 502A will divide at node 516 into two return currents 503A and 504A. The magnitudes of the currents 503A and 504A will depend primarily on the impedances of the respective return paths (i.e., looking into select switches 168 and 166, respectively). Assuming that the impedances of the two return paths are substantially equal to one another, currents 503A and 504A will each have a magnitude of $\frac{1}{2}I_W$.

After passing through select switch 166 and local word line 138, current 504A will again divide at node 524 into two currents 505A and 506A. The magnitudes of the two currents 505A and 506A will depend on the relative impedances terminating each end of global word line 108. Assuming both ends of the global word line 108 are terminated equally, the currents 505A and 506A will each have a magnitude of $\frac{1}{4}I_W$. In a similar manner, after passing through select switch 168 and local word line 142, the current 503A will divide substantially equally at node 522 into two currents 507A and 508A each having a magnitude of $\frac{1}{4}I_W$, assuming global word line 112 is terminated with substantially equal impedances at each end. Thus, currents 505A, 506A, 507A and 508A are returned to respective write circuits (not shown) each configured as a current sink and operatively coupled at a respective end of global word lines 108 and 112.

FIG. 5B illustrates at least a portion of the MRAM shown in FIG. 1, illustrating an exemplary conduction network 500 configured so that the total write current $I_W$ can be sourced from four separate current sources along two global word lines 108 and 112 and can be returned along a single adjacent global word line 110. Like the methodology previously described in conjunction with FIG. 5A, it will be assumed that the desired write circuits (not shown), which are configurable for sourcing or sinking at least a portion of the write current, are operatively coupled to the desired global word lines by activating the appropriate row switches (not shown) corresponding to the desired global word lines.

As apparent from the figure, a first current 505B, which has a magnitude of one quarter the total write current (i.e., $\frac{1}{4}I_W$), is sourced from a first end of global word line 108, and a second current 506B, which also has a magnitude of $\frac{1}{4}I_W$, is sourced from a second end of global word line 108. The two currents 505B, 506B sum together at node 524 to form the current 504B having a magnitude of $\frac{1}{2}I_W$, which flows through local word line 138 and select switch 166 which is assumed to be activated (i.e., turned on). Similarly, a third current 507B, which has a magnitude of $\frac{1}{4}I_W$, is sourced from a first end of global word line 112, and a fourth current 508B, which also has a magnitude of $\frac{1}{4}I_W$, is sourced from a second end of global word line 112. The two currents 507B, 508B sum together at node 522 to form the current 503B having a magnitude of $\frac{1}{2}I_W$, which flows through local word line 142 and select switch 168 which is assumed to be activated. The two currents 504B, 503B flowing through the select switches 166, 168, respectively, sum again at node 516 to form the write current 502B, having a magnitude of $I_W$, which flows through the local word line 126 corresponding to the selected memory cells 102. The direction of the write current 502B in FIG. 5B is reversed compared to the direction of the write current 502A shown in FIG. 5A.

FIG. 5C depicts yet another alternative methodology for directing the write current through the global and local word lines in the exemplary MRAM array, in accordance with the present invention. In FIG. 5C, the exemplary conduction network 500 is configured so that the total write current $I_W$ can be sourced from one current source along a single global word line 110 and can be returned to two separate current sinks along two neighboring global word lines 108 and 112. Like the methodology previously described in conjunction with FIGS. 5A and 5B, it will be assumed that the desired write circuits (not shown) for sourcing and/or sinking at least a portion of the write current are operatively coupled to the desired global word lines by activating the appropriate row switches (not shown) corresponding to the desired global word lines.

As shown in the figure, current 518C having a magnitude of $I_W$ is sourced by a write circuit (not shown) operatively coupled to one end of global word line 110. The other end of global word line 110 may be left unterminated (i.e., substantially open) so that the entire current 518C flows into node 520, thereby forming the write current 502C which passes through local word line 126 corresponding to the selected memory cells 102. At node 516, the write current 502C divides into currents 503C and 504C each having a magnitude of ½$I_W$, assuming select switches 166 and 168 are both activated and the respective impedances looking into the switches 166, 168 are substantially the same. Assuming only one end of neighboring global word line 108 is terminated, the current 504C will not divide at node 524 but will instead form current 506C having an equal magnitude ½$I_W$. Current 506C will then traverse along global word line 108 where it will be returned to a current sink (not shown) coupled thereto. Likewise, assuming only one end of neighboring global word line 112 is terminated, the current 503C will not divide at node 522 but will instead form current 508C of equal magnitude ½$I_W$. Current 508C will traverse along global word line 112 where it will be returned to a current sink (not shown) coupled thereto.

As previously explained, the aforementioned illustrative alternatives depicted in FIGS. 5A through 5C are contemplated by the present invention for controlling the application of a hard axis field to one or more selected memory cells in the exemplary MRAM. Furthermore, the techniques of the invention described herein may be employed for controlling leakage fields and/or other stray magnetic fields, that may be coupled into unselected or half-selected neighboring memory cells.

Figure 6:
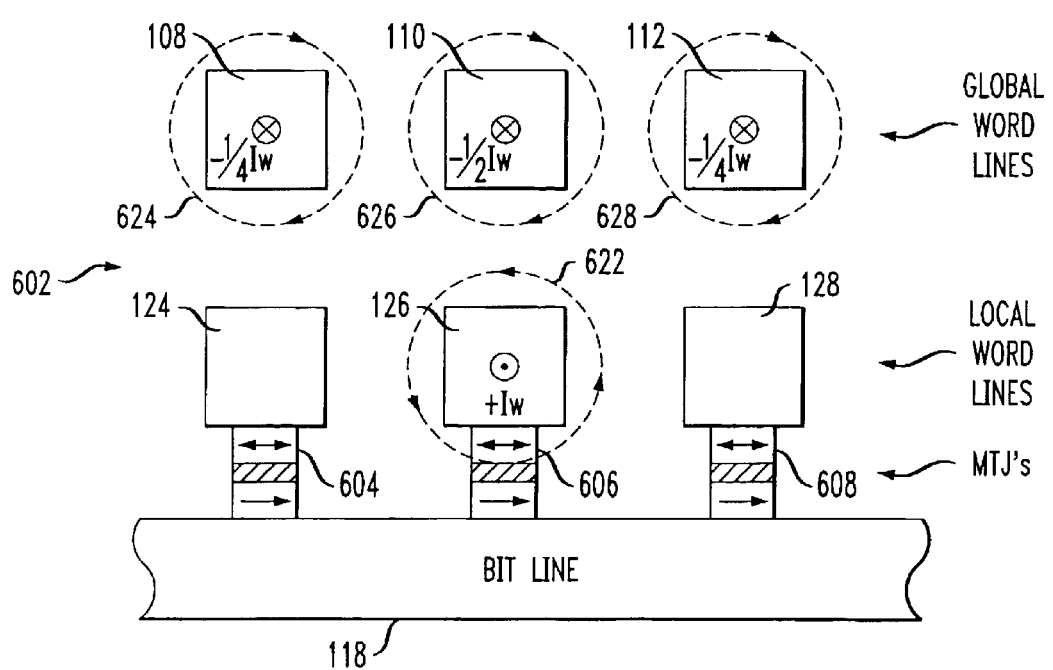
FIG. 6 is a diagram illustrating a methodology for canceling stray magnetic fields employing the steering circuitry of FIG. 5A, in accordance with one aspect of the present invention.

FIG. 6 illustrates a cross section 602 of at least a portion of the exemplary MRAM depicted in FIG. 1, comprising global word lines 108, 110 and 112, local word lines 124, 126 and 128, bit line 118, and memory cells (MTJs) 604, 606 and 608. The cross section may be obtained, for example, by sectioning the exemplary conduction network shown in FIG. 5A along section line 600 and by adding local word lines 124 and 128, bit line 118, and memory cells (MTJs) 604 and 608. The cross section 602 will be used to explain how the hard axis field is applied to a selected memory cell 606 and how the leakage fields are coupled into the neighboring memory cells 604 and 608.

Recall that a magnetic field is a continuous field which circulates around a current carrying conductor (according to the well-known right hand rule). The strength of the magnetic field decays as a function of the inverse of the radial distance from the conductor. Unfortunately, when a magnetic field is applied to selected memory cells by means of a current passing through a conductor, a fraction of the field intended for the selected memory cells may also be coupled to the neighboring unselected memory cells. This leakage field may significantly reduce the write margin between selected and unselected memory cells, with half-selected memory cells being of most concern.

For example, with reference to FIG. 6, assume that local word line 126 carries a write current $I_W$ in a direction that is out of the page, thus generating a magnetic field 622 associated therewith having field lines rotating in a counterclockwise direction as shown. A portion of the magnetic field 622 intended exclusively for selected memory cell 606 is coupled into neighboring unselected cells 604 and 608. Other magnetic fields, for example, field 626 emanating from global word line 110 used to source current, and fields 624 and 628 emanating from global word lines 108 and 112, respectively, used to return at least a portion of the current which traverses through the exemplary MRAM circuit, can be used in combination to reduce the strength of the leakage field on the neighboring unselected memory cells, in accordance with a preferred embodiment of the invention.

Given that the global word lines 108, 110 and 112 carry current opposite in polarity with respect to the current carried by local word line 126, the magnetic fields 624, 626 and 628, respectively, emanating therefrom can be used to advantageously cancel a substantial portion of the leakage field(s) coupled to neighboring unselected memory cells 604 and 608, the byproduct of a write operation directed to selected memory cell 606. The sum of in-plane magnetic field components directed along the hard axis of the magnetic storage element comprised in the unselected memory cells 604 and 608 can be significantly diminished because the in-plane component of magnetic field 622 is substantially canceled by the in-plane components of magnetic fields 624, 626 and 628. The magnitude of the in-plane component of the magnetic field applied to unselected memory cells 604 and 608 will ultimately depend primarily upon the sign and magnitude of the currents flowing within the surrounding conductors and the geometry (e.g., physical layout and vertical distances) of the MRAM architecture.

Since there is no single unique solution for field cancellation that is suitable for all MRAM architectures, the present invention contemplates an unlimited number of alternative arrangements, some of which have been previously described in conjunction with FIGS. 5A–5C. The present invention further contemplates that the geometry of current carrying conductors can be optimally configured, in accordance with the aforementioned alternative arrangements of the invention, for using current flow to reduce the leakage field in comparison to the magnetic field coupled to a selected memory cell(s). Using the techniques of the present invention, magnetic field simulations can be used to determine an optimal configuration for a given MRAM architecture.

Regardless of the MRAM configuration employed, a decoder logic tree is preferably used to activate the select switches in the MRAM circuit. Table 1 below defines exemplary logic for computing control signals WSEL0, WSEL1 and WSEL2 which maybe used in conjunction with bit slice signals (e.g., bit decode signals) to activate the select switches 162 through 184 via the select lines 186 through 196 shown in FIG. 1. The control signals WSEL0, WSEL1, WSEL2 are preferably presented to a decoder which operatively generates the appropriate select signals applied to the select lines.

TABLE 1

| Word Address ABCD | Global Word Line | WSEL0 | WSEL1 | WSEL2 |
|---|---|---|---|---|
| 0000 | — | 1 | 1 | 0 |
| 0001 | — | 0 | 1 | 1 |
| 0010 | — | 1 | 0 | 1 |
| 0011 | — | 1 | 1 | 0 |
| 0100 | — | 0 | 1 | 1 |
| 0101 | 104 | 1 | 0 | 1 |
| 0110 | 106 | 1 | 1 | 0 |
| 0111 | 108 | 0 | 1 | 1 |
| 1000 | 110 | 1 | 0 | 1 |
| 1001 | 112 | 1 | 1 | 0 |
| 1010 | 114 | 0 | 1 | 1 |
| 1011 | 116 | 1 | 0 | 1 |
| 1100 | — | 1 | 1 | 0 |
| 1101 | — | 0 | 1 | 1 |
| 1110 | — | 1 | 0 | 1 |
| 1111 | — | 1 | 1 | 0 |

Although three control signals, namely, WSEL0, WSEL1 and WSEL2, are a minimum number required to isolate the three active global word lines from the inactive global word lines biased to the equipotential voltage Veq in the exemplary cross-point MRAM, as presented in Table 1, four control signals are preferable at least for simplifying the decoder logic tree.

Figure 7:
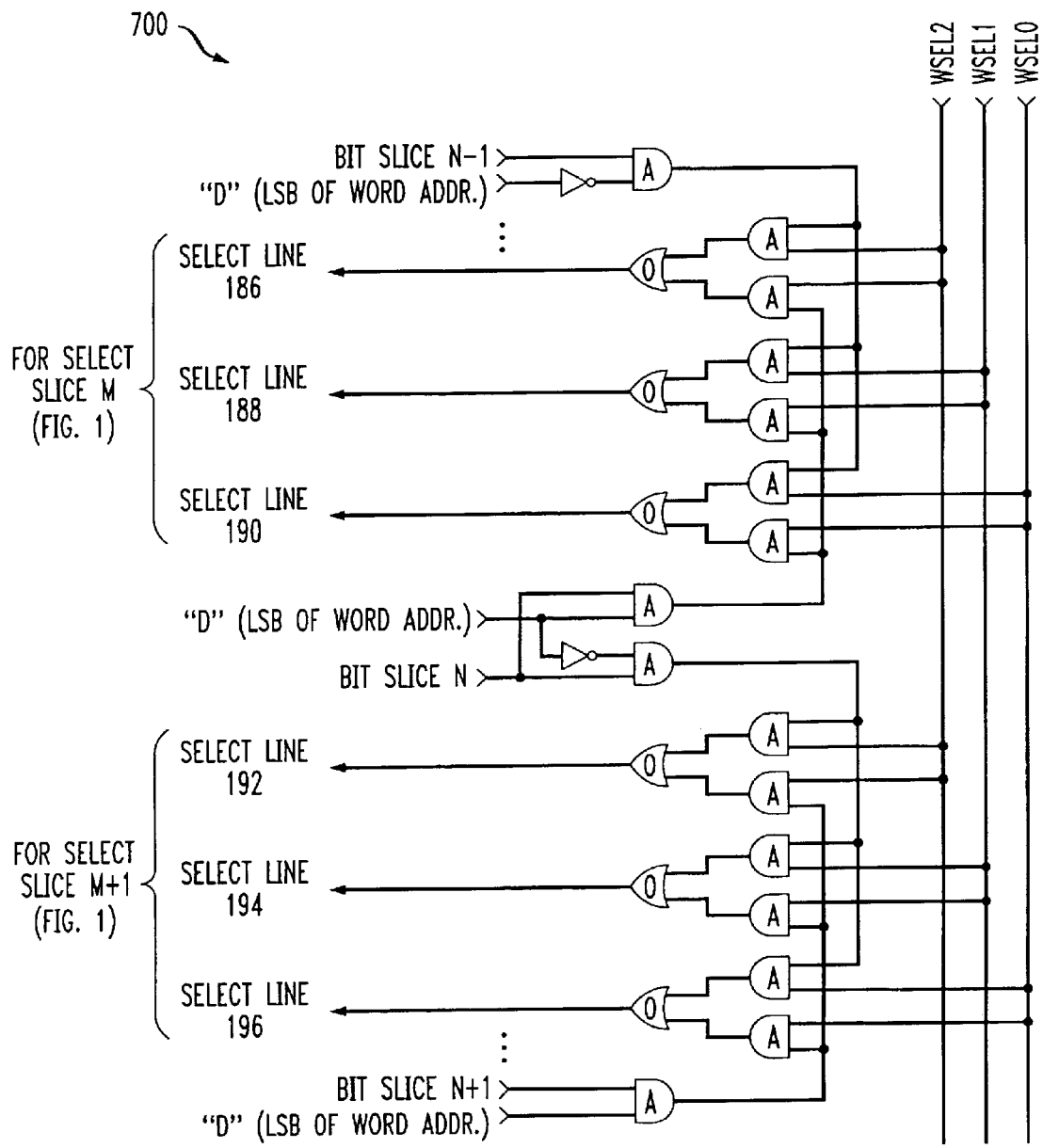
FIG. 7 is an exemplary logic diagram of address decode circuitry which may be used for driving the select slice inputs of the exemplary MRAM array shown in FIG. 1, in accordance with the present invention.

FIG. 7 illustrates an exemplary decoder 700 which may be used to generate the select signals for selectively activating the select switches in the illustrative MRAM 100 shown in FIG. 1, in accordance with one embodiment of the present invention. As previously stated, the select switches are used to selectively control the path of write current flow in the MRAM. It is to be appreciated that the invention is not limited to the particular decoder shown. The exemplary decoder 700 utilizes the three control signals WSEL0, WSEL1, WSEL2 and the least significant bit (LSB), bit D, of the word address shown in Table 1 above, along with corresponding bit slice select signals, as inputs to generate the select signals applied to select lines 186 through 196 in the exemplary MRAM of FIG. 1.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A write circuit for assisting in writing a logical state of one or more magnetic memory cells in a magnetic random access memory (MRAM) including a plurality of global word lines, the write circuit comprising:

at least one programmable current source being couplable to at least one of the global word lines, the programmable current source including an input for receiving a first control signal and an output, the programmable current source generating at least a portion of a write current at the output having a magnitude which varies in response to the first control signal;

a plurality of current sinks, each current sink being couplable to at least one of the global word lines, each current sink including an input for receiving a second control signal, each current sink returning at least a portion of the write current in response to the second control signal; and a controller operatively coupled to the at least one programmable current source and the plurality of current sinks, the controller being operative to generate the first and second control signals and to selectively distribute the write current across two or more of the global word lines in the MRAM so that stray magnetic field interaction between selected memory cells and unselected memory cells in the MRAM is reduced.

2. The circuit of claim 1, wherein the controller is operative to couple a voltage to first and second ends of at least one global word line corresponding to unselected memory cells in the MRAM.

3. The circuit of claim 2, wherein the voltage coupled to the first and second ends of the at least one global word line corresponding to unselected memory cells in the MRAM comprises an equipotential voltage.

4. The circuit of claim 1, wherein the controller is operative to distribute the write current such that the write current is supplied along a first global word line to a local word line corresponding to the selected memory cells in the MRAM, the local word line being connected to the first global word line, and the write current is returned to at least first and second current sinks along at least second and third global word lines operatively coupled to the first and second current sinks, respectively.

5. The circuit of claim 4, wherein the at least second and third global word lines are adjacent to the first global word line.

6. The circuit of claim 1, wherein the controller is operative to distribute the write current such that at least a portion of the write current is supplied by each of at least first and second programmable current sources along at least a first global word line operatively coupled to the at least first and second programmable current sources, and the write current is returned to at least first and second current sinks along at least second and third global word lines operatively coupled to the first and second current sinks, respectively.

7. The circuit of claim 6, wherein the at least second and third global word lines are adjacent to the at least first global word line.

8. The circuit of claim 6, wherein the controller is operative to vary the magnitude of the currents at the respective outputs of the at least first and second programmable current sources so that a summation of the currents supplied by the at least first and second programmable current sources is substantially equal to the write current.

9. The circuit of claim 6, wherein the currents supplied by the at least first and second programmable current sources arc summed at a local word line corresponding to the selected memory cells, the local word line being connected to the at least first global word line.

10. The circuit of claim 1, further comprising a plurality of switches, each of the switches including first, second and third terminals and being configured for providing an electrical connection between the first and second terminals in response to a control signal presented to the third terminal, at least a portion of the switches being connected together in a series chain, wherein the first terminal of one switch in the chain is connected to the second terminal of another switch in the chain, the at least a portion of the switches being configured such that the first terminal of a given switch in the chain is coupled to a corresponding local word line in the MRAM.

11. The circuit of claim 10, further comprising at least one decoder operatively coupled to at least a portion of the plurality of switches, the decoder being configurable for distributing the write current throughout the MRAM such that a stray magnetic field generated at least in part by write current flowing through a local word line corresponding to the selected memory cells is substantially reduced in at least one unselected memory cell in the MRAM.

12. The circuit of claim 10, wherein the MRAM comprises a plurality of bit lines and local word lines operatively coupled to the plurality of memory cells, the MRAM being organized into a plurality of bit slices, each of the bit slices including at least one bit line and at least one memory cell coupled to the at least one bit line, each of the at least a portion of switches being configured such that the first terminal is coupled to a local word line corresponding to a first bit slice and the second terminal is coupled to a local word line corresponding to a second bit slice adjacent to the first bit slice.

13. The circuit of claim 12, wherein at least a portion of the bit slices are arranged in a substantially vertical dimension.

14. The circuit of claim 10, wherein each of at least a portion of the switches comprises a field-effect transistor (FET) including a drain terminal, a source terminal, and a gate terminal, the drain, source and gate terminals of the FET forming the first, second and third terminals, respectively, of the switch.

15. The circuit of claim 1, wherein the controller is operative to distribute the write current throughout the MRAM such that a stray magnetic field generated at least in part by write current flowing through a local word line corresponding to the selected memory cells is substantially reduced in at least one unselected memory cell in the MRAM.

16. The circuit of claim 15, wherein the controller is operative to distribute the write current over at least one of a plurality of global word lines and a plurality of local word lines in the MRAM such that the stray magnetic field is substantially canceled by magnetic fields generated at least in part by currents flowing through at least one of the plurality of global word lines and the plurality of local word lines.

17. The circuit of claim 1, wherein the circuit is implemented in a semiconductor device.

18. A semiconductor device including at least one write circuit, the at least one write circuit comprising:

at least one programmable current source being couplable to at least one of the global word lines, the programmable current source including an input for receiving a first control signal and an output, the programmable current source generating at least a portion of a write current at the output having a magnitude which varies in response to the first control signal;

a plurality of current sinks, each current sink being couplable to at least one of the global word lines, each current sink including an input for receiving a second control signal, each current sink returning at least a portion of the write current in response to the second control signal; and a controller operatively coupled to the at least one programmable current source and the plurality of current sinks, the controller being operative to generate the first and second control signals and to selectively distribute the write current across a plurality of global word lines in the MRAM so that stray magnetic field interaction between selected memory cells and at least one of half-selected memory cells and unselected memory cells in the MRAM is reduced.

19. The device of claim 18, wherein the controller in the at least one write circuit is operative to couple a voltage to first and second ends of at least one global word line corresponding to unselected memory cells in the MRAM.

20. The device of claim 18, wherein the controller in the at least one write circuit is operative to distribute the write current such that the write current is supplied along a first global word line to a local word line corresponding to the selected memory cells in the MRAM, the local word line being connected to the first global word line, and the write current is returned to at least first and second current sinks along at least second and third global word lines operatively coupled to the first and second current sinks, respectively.

21. The device of claim 18, wherein the controller in the at least one write circuit is operative to distribute the write current such that at least a portion of the write current is supplied by each of at least first and second programmable current sources along at least a first global word line operatively coupled to the at least first and second programmable current sources, and the write current is returned to at least first and second current sinks along at least second and third global word lines operatively coupled to the first and second current sinks, respectively.

22. The device of claim 18, wherein the at least one write circuit further comprises a plurality of switches, each of the switches including first, second and third terminals and being configured for providing an electrical connection between the first and second terminals in response to a control signal presented to the third terminal, at least a portion of the switches being connected together in a series chain, wherein the first terminal of one switch in the chain is connected to the second terminal of another switch in the chain, the at least a portion of the switches being configured such that the first terminal of a given switch in the chain is coupled to a corresponding local word line in the MRAM.

23. The device of claim 22, wherein the at least one write circuit further comprises at least one decoder operatively coupled to at least a portion of the plurality of switches, the decoder being configurable for distributing the write current throughout the MRAM such that a stray magnetic field generated at least in part by write current flowing through a local word line corresponding to the selected memory cells is substantially reduced in at least one unselected memory cell in the MRAM.

* * * * *